United States Patent
Yuan et al.

(10) Patent No.: US 8,432,206 B2
(45) Date of Patent: Apr. 30, 2013

(54) DELAY LOCK LOOP SYSTEM WITH A SELF-TRACKING FUNCTION AND METHOD THEREOF

(75) Inventors: Der-Min Yuan, New Taipei (TW); Kuang-Fu Teng, Ping-Tung County (TW); Chun Shiah, Hsinchu (TW); Feng-Chia Chang, New Taipei (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/425,379

(22) Filed: Mar. 20, 2012

(65) Prior Publication Data

US 2012/0256666 A1    Oct. 11, 2012

(30) Foreign Application Priority Data

Apr. 7, 2011  (TW) .............................. 100112090 A

(51) Int. Cl.
*H03L 7/06* (2006.01)
(52) U.S. Cl.
USPC .......................................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 7,705,649 | B1 * | 4/2010 | Yu et al. | 327/175 |
| 8,049,545 | B2 * | 11/2011 | Kim et al. | 327/158 |
| 8,207,768 | B2 * | 6/2012 | Booth et al. | 327/156 |
| 2006/0027404 | A1 * | 2/2006 | Foxlin | 178/18.06 |
| 2009/0267663 | A1 * | 10/2009 | Varricchione | 327/158 |
| 2011/0298513 | A1 * | 12/2011 | Na et al. | 327/175 |
| 2012/0256666 | A1 * | 10/2012 | Yuan et al. | 327/158 |

* cited by examiner

*Primary Examiner* — Adam Houston
(74) *Attorney, Agent, or Firm* — Winston Hsu; Scott Margo

(57) ABSTRACT

A delay lock loop system includes a timing controller, an OR gate, an input buffer, a pulse generator, and a delay lock loop. The timing controller is used for outputting an external enable signal periodically while a power saving signal is at a logic-low voltage, and being disabled according to a logic-high voltage of the power saving signal. The pulse generator is used for generating a pulse according to the positive edge of the power saving signal. The OR gate is coupled to the timing controller for receiving the power saving signal, the pulse, and the external enable signal, and outputting an enable signal according to the power saving signal and the external enable signal. The delay lock loop is coupled to the OR gate and the input buffer for enabling the delay lock loop again according to the enable signal.

7 Claims, 15 Drawing Sheets

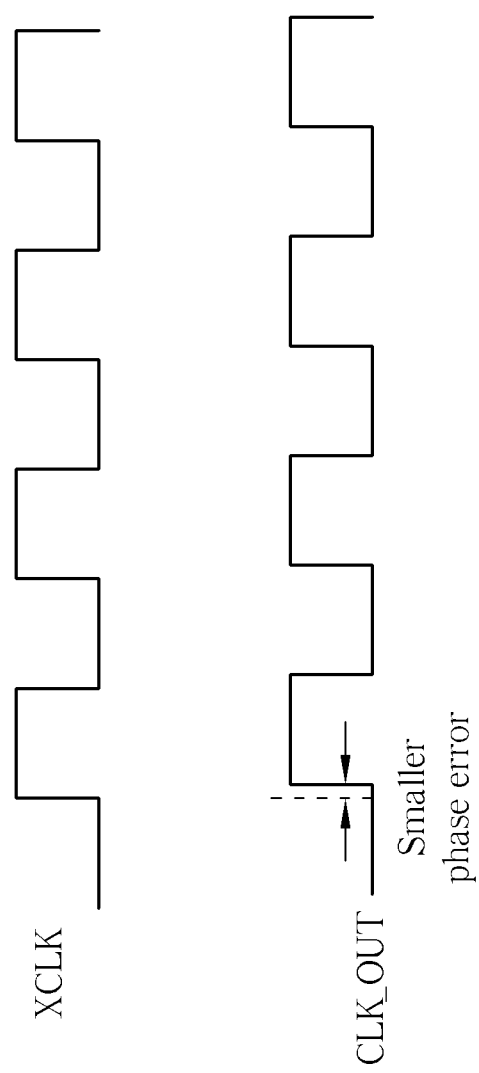

DELAY LOCK LOOP SYSTEM WITH A SELF-TRACKING FUNCTION AND METHOD THEREOF

BACKGROUND OF THE INVENTION

1. Field of the Invention

The present invention is related to a delay lock loop system, and particularly to a delay lock loop system with a self-tracking function.

2. Description of the Prior Art

Please refer to FIG. 1. FIG. 1 is a diagram illustrating a delay lock loop 100 according to the prior art. When the delay lock loop 100 enters a power saving mode, circuit units included by the delay lock loop 100 are disabled. Please refer to FIG. 2A and FIG. 2B. FIG. 2A is a diagram illustrating a capacitor 102 leaking in the power saving mode (meanwhile, a power saving signal CKE is at a logic-low voltage), resulting in a voltage of a control node VCTRL controlling a voltage control delay circuit 104 being reduced. FIG. 2B is a diagram illustrating the delay lock loop 100 having a greater phase error because of a reduced voltage of the control node VCTRL when the delay lock loop 100 is enabled again. As shown in FIG. 2A, when the delay lock loop 100 enters the power saving mode, energy stored in the capacitor 102 decreases gradually until the delay lock loop 100 is enabled again. Therefore, as shown in FIG. 2B, when delay lock loop 100 is enabled again, the delay lock loop 100 has the greater phase error, because the delay lock loop 100 has to recharge a leakage of the capacitor 102 (that is, the reduced voltage of a control node VCTRL). In addition, please refer to FIG. 2C. FIG. 2C is a diagram illustrating a relationship between a temperature of the delay lock loop 100 and delay time of the delay lock loop 100. As shown in FIG. 2C, when the delay lock loop 100 is enabled again, delay time of the delay lock loop 100 is shorter than delay time of the delay lock loop 100 operating at a normal temperature T, because the temperature of the delay lock loop 100 is decreased gradually during the power saving mode. Therefore, when the power saving signal CKE is changed from the logic-low voltage to a logic-high voltage (that is, the delay lock loop 100 is enabled again), the delay lock loop 100 has the greater phase error, because the delay lock loop 100 has the shorter delay time.

SUMMARY OF THE INVENTION

An embodiment provides a delay lock loop system with a self-tracking function. The delay lock loop system includes a timing controller, a pulse generator, an OR gate, an input buffer, and a delay lock loop. The timing controller is used for outputting an external enable signal periodically while a power saving signal is a logic-low voltage, and being disabled according to a logic-high voltage of the power saving signal. The pulse generator is used for generating a pulse according to a positive edge of the power saving signal. The OR gate has a first terminal for receiving the power saving signal, a second terminal coupled to the timing controller for receiving the external enable signal, a third terminal coupled to the pulse generator for receiving the pulse, and an output terminal for outputting an enable signal. The input buffer is used for receiving an external clock, and outputting an adjusted clock. The delay lock loop is coupled to the OR gate and the input buffer for receiving the adjusted clock and the enable signal. The delay lock loop includes a voltage control delay circuit for synchronizing a phase of the adjusted clock with a phase of an output clock of the delay lock loop. The delay lock loop is enabled again according to the enable signal.

Another embodiment provides a method of self tracking of a delay lock loop system. The method includes a timing controller outputting an external enable signal periodically; disabling the timing controller according to a logic-high voltage of a power saving signal, and a pulse generator generating a pulse according to a positive edge of the power saving signal; generating an enable signal according to the power saving signal, the external enable signal, and the pulse; enabling the delay lock loop again according to the enable signal.

Another embodiment provides a method of self tracking of a delay lock loop system. The method includes a timing controller receiving an external enable signal; the timing controller outputting the external enable signal according to a predetermined clock; disabling the timing controller according to a logic-high voltage of a power saving signal, and a pulse generator generating a pulse according to a positive edge of the power saving signal; generating an enable signal according to the power saving signal, the external enable signal, and the pulse; enabling the delay lock loop again according to the enable signal.

The present invention provides a delay lock loop system with a self-tracking function and method thereof. The delay lock loop system and the method utilize an OR gate to output an enable signal according to a power saving signal, a pulse, and an external enable signal while the power saving signal is at a logic-low voltage. Then, a delay lock loop can enable itself again according to the enable signal. Thus, because a leakage of a capacitor of the delay lock loop is smaller, the delay lock loop has a smaller phase error. In addition, the OR gate outputs the enable signal for enabling the delay lock loop according to the power saving signal, the pulse, and the external enable signal, and the delay lock loop can still track an environmental temperature while the power saving signal CKE is at the logic-low voltage. Therefore, when the delay lock loop is enabled again, a difference between delay time of the delay lock loop and delay time of the delay lock loop operating at a normal temperature is smaller, so an output clock of the delay lock loop has a smaller phase error.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5B is a diagram illustrating the output clock of the delay lock loop having a smaller phase error when the delay lock loop being enabled again after the power saving signal is changed from the logic-low voltage to the logic-high voltage.

DETAILED DESCRIPTION

Figure 1:
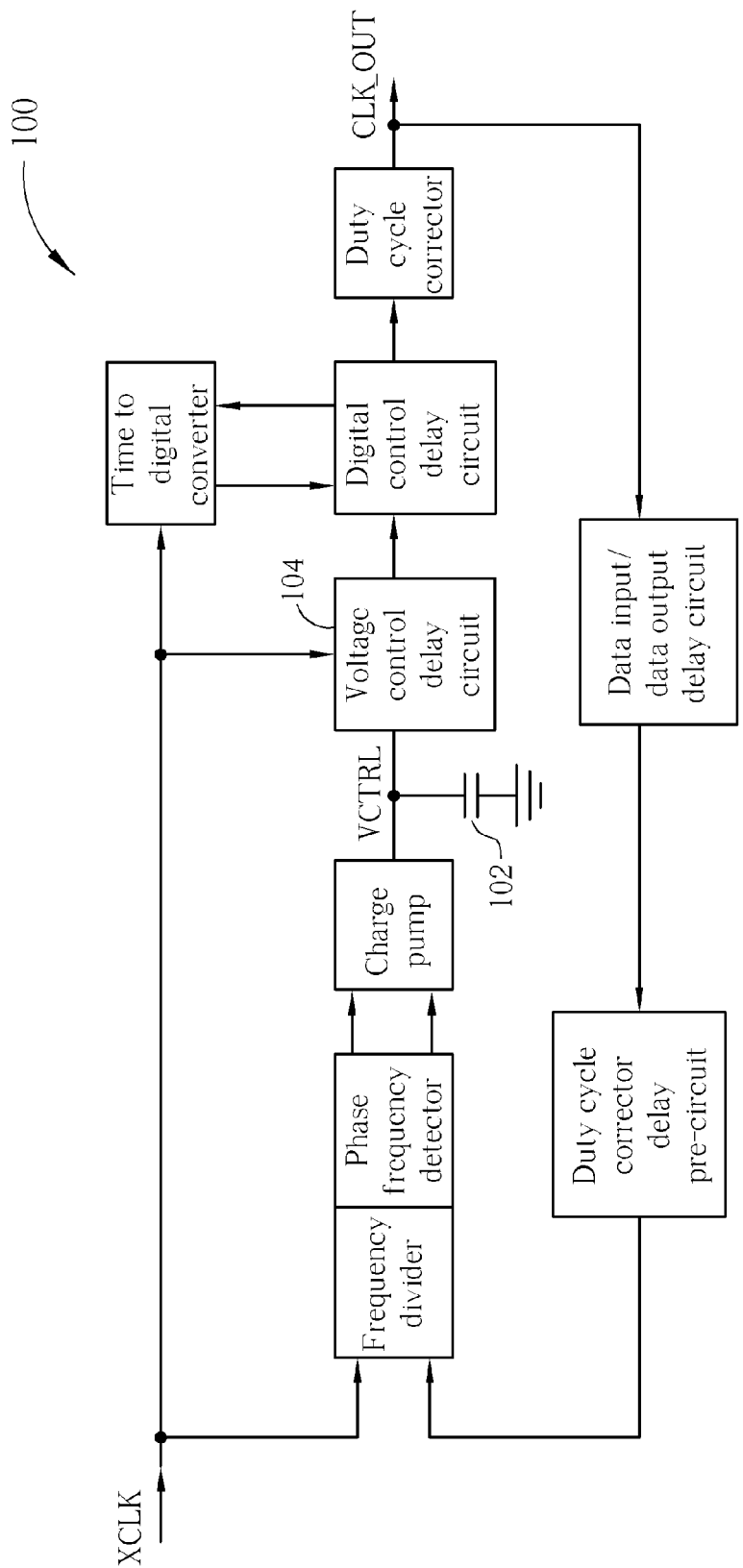
FIG. 1 is a diagram illustrating a delay lock loop according to the prior art.
Figure 2A:
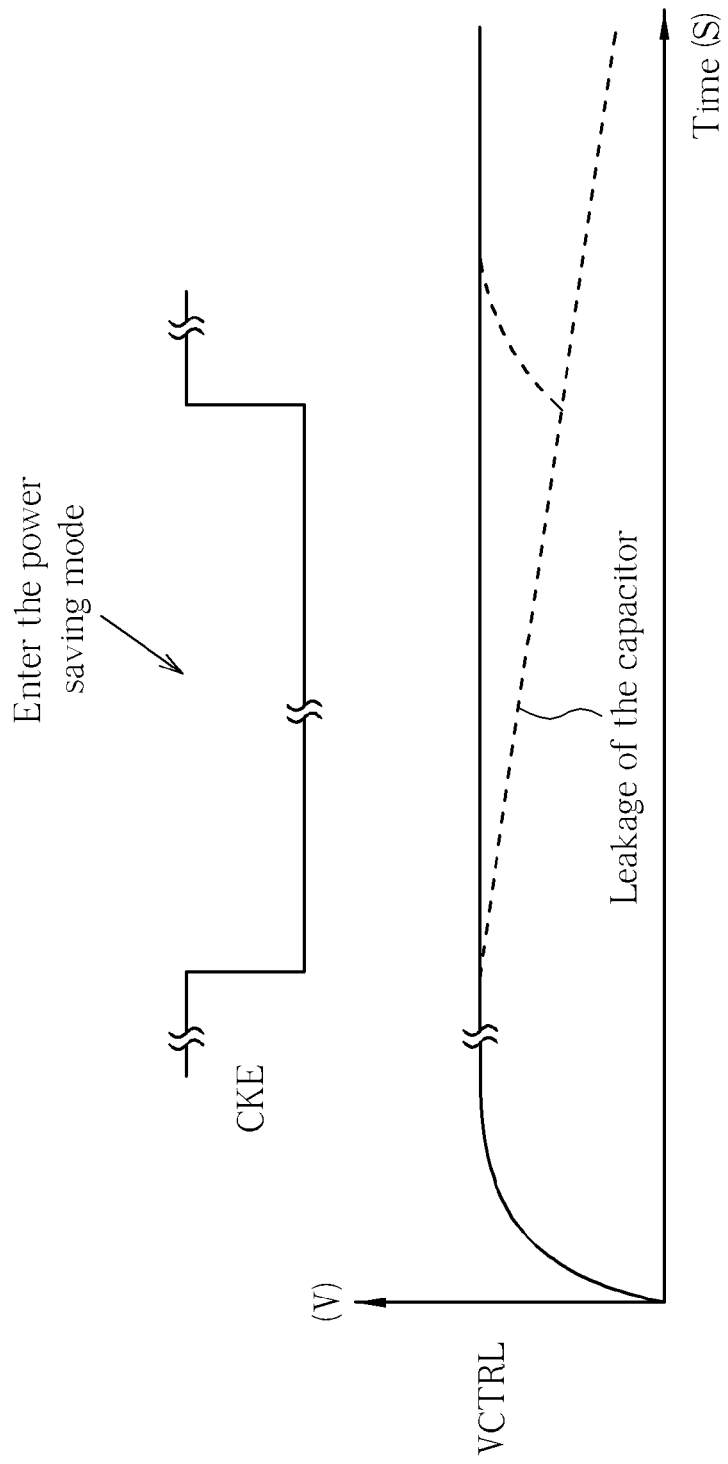
FIG. 2A is a diagram illustrating a capacitor leaking in the power saving mode, resulting in a voltage of a control node controlling a voltage control delay circuit being reduced.
Figure 2B:
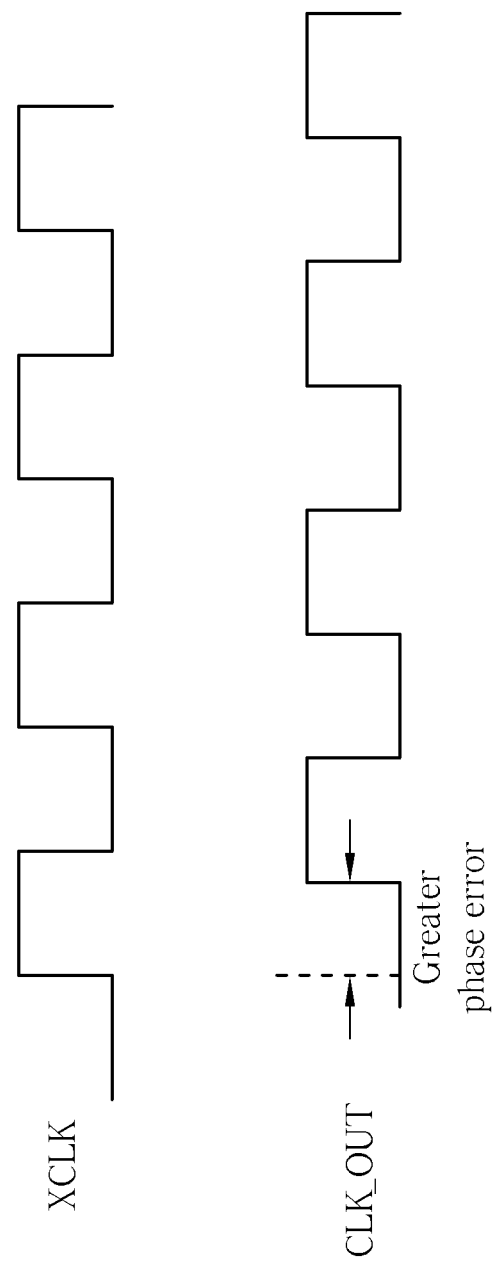
FIG. 2B is a diagram illustrating the delay lock loop having a greater phase error because of a reduced voltage of the control node when the delay lock loop is enabled again.
Figure 2C:
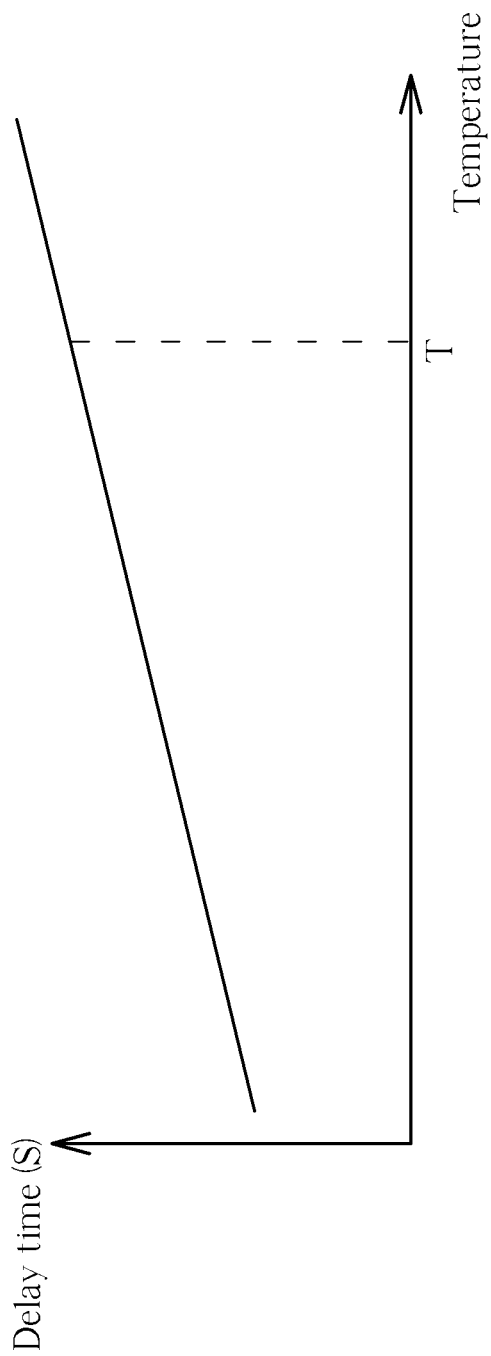
FIG. 2C is a diagram illustrating a relationship between a temperature of the delay lock loop and delay time of the delay lock loop.
Figure 3:
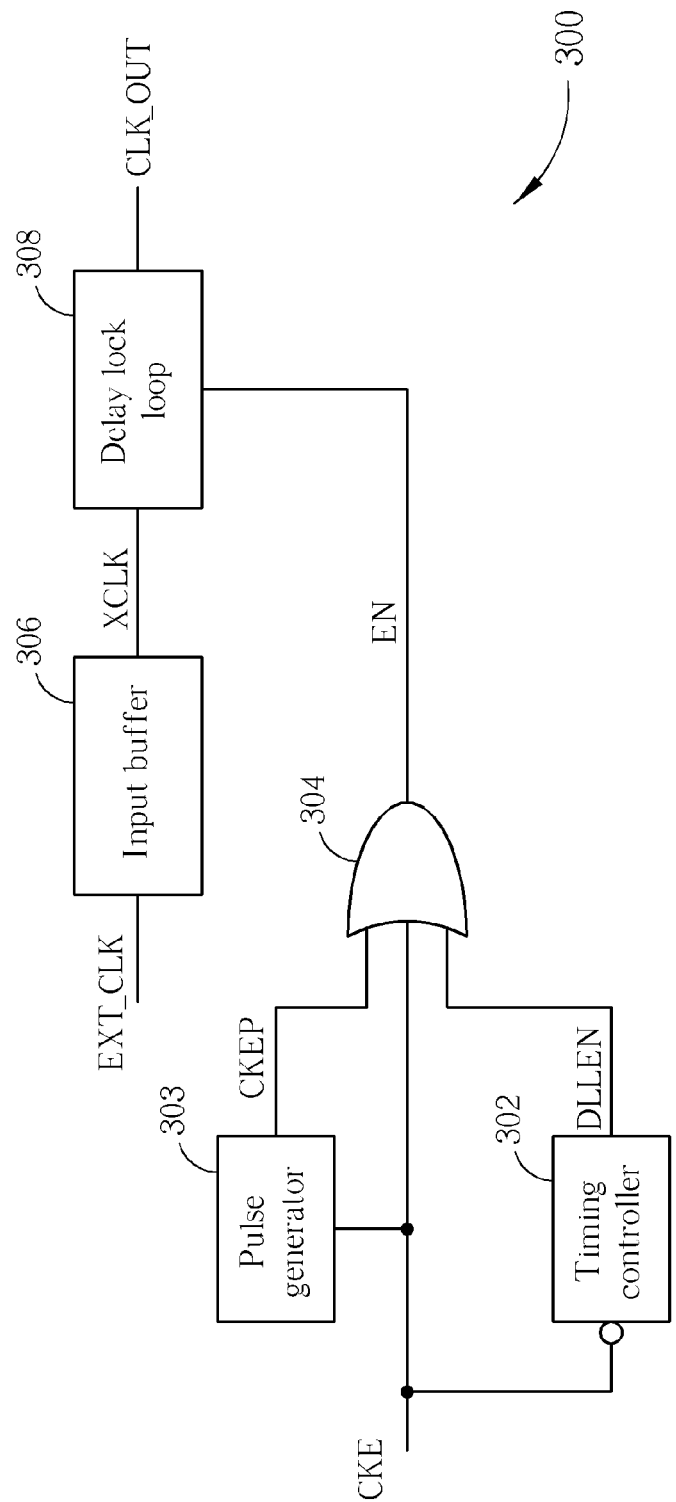
FIG. 3 is a diagram illustrating a delay lock loop system with a self-tracking function according to an embodiment.

Please refer to FIG. 3. FIG. 3 is a diagram illustrating a delay lock loop system 300 with a self-tracking function according to an embodiment. The delay lock loop system 300 includes a timing controller 302, a pulse generator 303, an OR gate 304, an input buffer 306, and a delay lock loop 308. The timing controller 302 is used for outputting an external enable signal DLLEN periodically, and being disabled according to a logic-high voltage of a power saving signal CKE while the power saving signal CKE is a logic-low voltage. The pulse generator 303 is used for generating a pulse CKEP according to a positive edge of the power saving signal CKE. The OR gate 304 has a first terminal for receiving the power saving signal CKE, a second terminal coupled to the timing controller 302 for receiving the external enable signal DLLEN, a third terminal coupled to the pulse generator 303 for receiving pulse CKEP, and an output terminal for outputting an enable signal EN. The input buffer 306 is used for receiving an external clock EXT_CLK, and outputting an adjusted clock XCLK. The delay lock loop 308 is coupled to the input buffer 306 and the OR gate 304 for receiving the adjusted clock XCLK and the enable signal EN. A voltage control delay circuit 104 included by the delay lock loop 308 is used for synchronizing a phase of the adjusted clock XCLK and a phase of an output clock CLK_OUT of the delay lock loop 308, and the delay lock loop 308 can enable itself again according to the enable signal EN.

Figure 4:
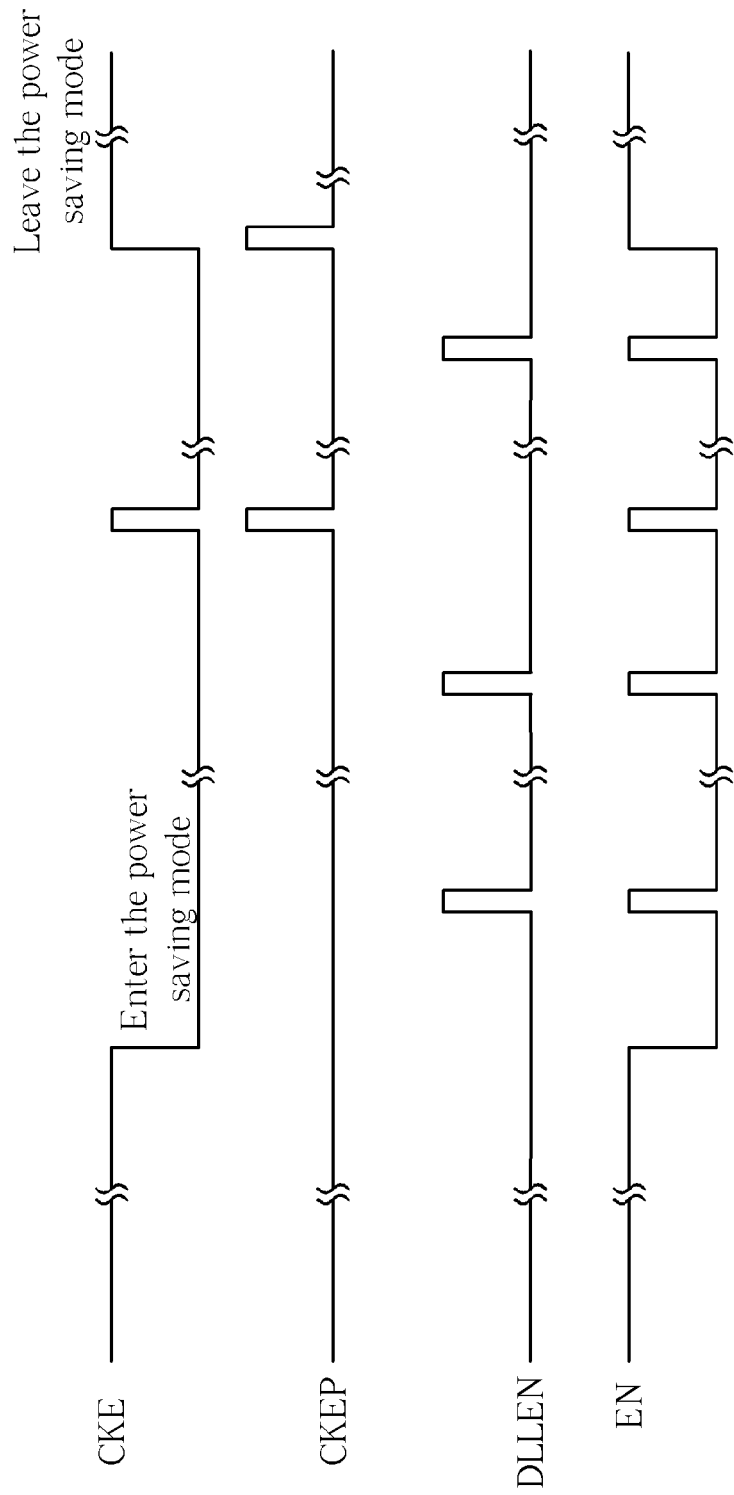
FIG. 4 is a timing diagram illustrating timings of the power saving signal, the pulse, the external enable signal, and the enable signal.

Please refer to FIG. 4. FIG. 4 is a timing diagram illustrating timings of the power saving signal CKE, the pulse CKEP, the external enable signal DLLEN, and the enable signal EN. When the power saving signal CKE is at a logic-low voltage, the delay lock loop 308 is disabled, that is, the delay lock loop 308 enters a power saving mode. The OR gate 304 outputs the enable signal EN according to the power saving signal CKE, the pulse CKEP, and the external enable signal DLLEN. Therefore, as shown in FIG. 4, during the power saving signal CKE being at the logic-low voltage, the OR gate 304 still outputs the enable signal EN according to the power saving signal CKE, the pulse CKEP, and the external enable signal DLLEN. Therefore, the delay lock loop 308 can still enable itself again according to the enable signal EN during the power saving signal CKE being at the logic-low voltage. In addition, as shown in FIG. 4, the timing controller 302 can be disabled according to the logic-high voltage of the power saving signal CKE, and the timing controller 302 does not output the external enable signal DLLEN.

Figure 5A:
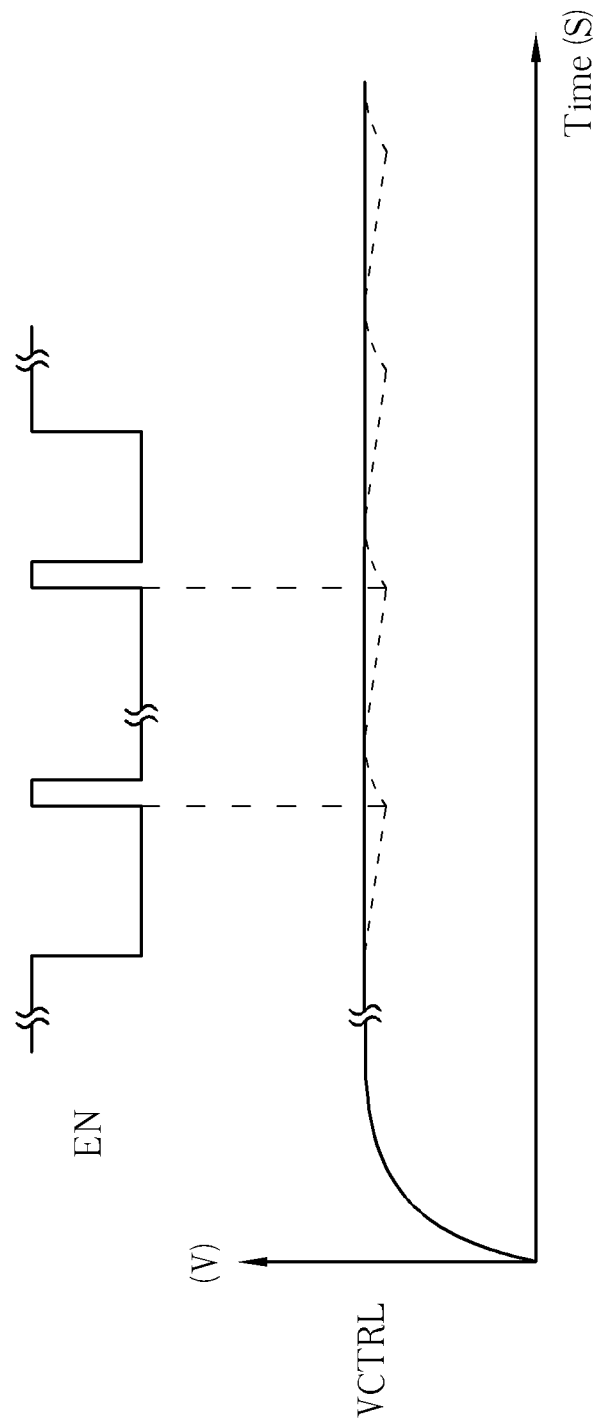
FIG. 5A is a diagram illustrating the capacitor being charged according to the enable signal in FIG. 4 during the power saving signal being at the logic-low voltage.

Please refer to FIG. 5A and FIG. 5B. FIG. 5A is a diagram illustrating the capacitor 102 being charged according to the enable signal EN in FIG. 4 during the power saving signal CKE being at the logic-low voltage, and FIG. 5B is a diagram illustrating the output clock CLK_OUT of the delay lock loop 308 having a smaller phase error when the delay lock loop 308 is enabled again after the power saving signal CKE is changed from the logic-low voltage to the logic-high voltage. As shown in FIG. 5A, during the power saving signal CKE being at the logic-low voltage, because the OR gate 304 outputs the enable signal EN for enabling the delay lock loop 308 according to the power saving signal CKE and the external enable signal DLLEN, the capacitor 102 of the delay lock loop 308 can still be charged temporarily. Therefore, as shown in FIG. 5B, after the power saving signal CKE is changed from the logic-low voltage to the logic-high voltage, although the delay lock loop 308 still recharges a leakage of the capacitor 102 (that is, a reduced voltage of a control node VCTRL), the output clock CLK_OUT of the delay lock loop 308 has the smaller phase error because the leakage of the capacitor 102 is smaller. In addition, because the OR gate 304 outputs the enable signal EN for enabling the delay lock loop 308 according to the power saving signal CKE and the external enable signal DLLEN, the delay lock loop 308 can still track an environmental temperature during the power saving signal CKE being at the logic-low voltage. Thus, a difference between delay time of the delay lock loop 308 and delay time of the delay lock loop 308 operating at a normal temperature T is smaller, so the output clock CLK_OUT of the delay lock loop 308 has the smaller phase error.

Figure 6:
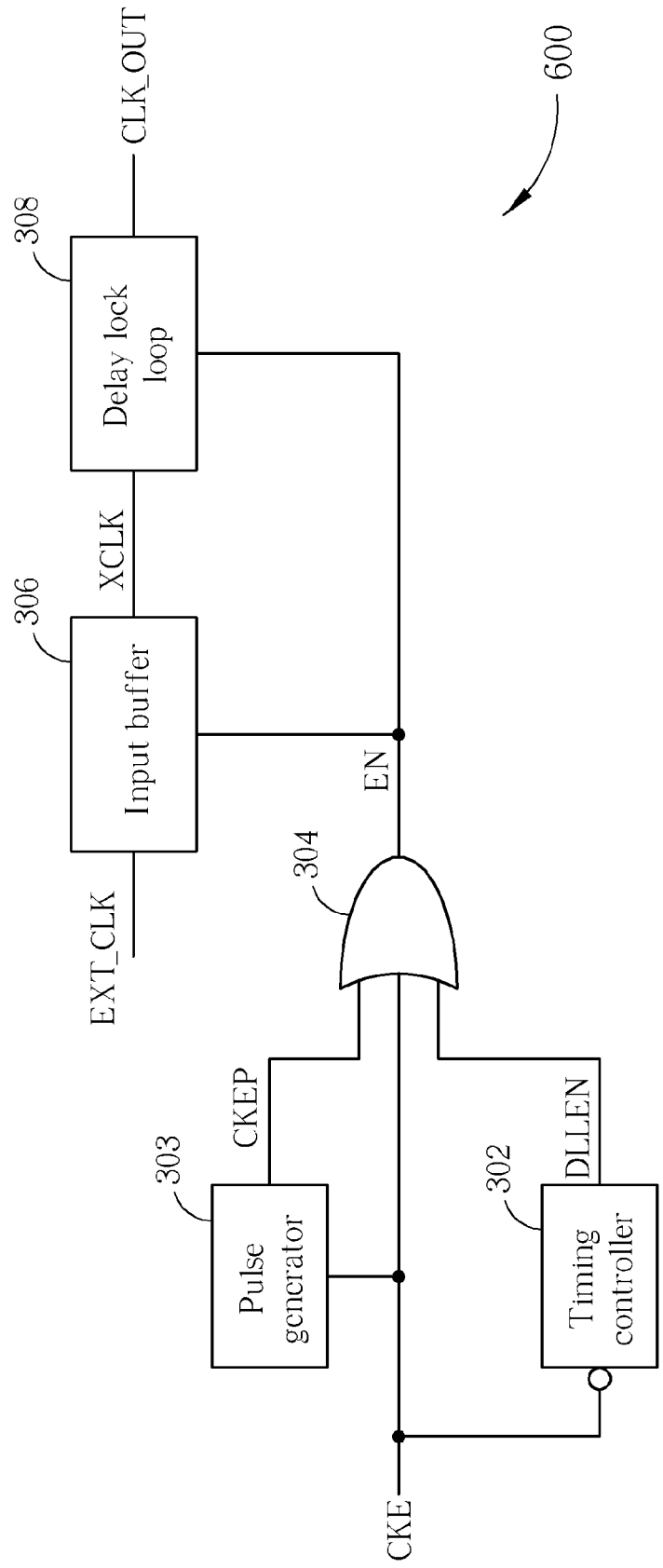
FIG. 6 is a diagram illustrating a delay lock loop system with a self-tracking function according to another embodiment.

Please refer to FIG. 6. FIG. 6 is a diagram illustrating a delay lock loop system 600 with a self-tracking function according to another embodiment. A difference between the delay lock loop system 600 and the delay lock loop system 300 is that the input buffer 306 of the delay lock loop system 600 is further coupled to the OR gate 304 for receiving enable signal EN. Therefore, because the OR gate 304 outputs the enable signal EN according to the power saving signal CKE and the external enable signal DLLEN while the power saving signal CKE is at the logic-low voltage, the input buffer 306 is also enabled temporarily. Further, subsequent operational principles of the delay lock loop system 600 are the same as those of the delay lock loop system 300, so further description thereof is omitted for simplicity.

Figure 7:
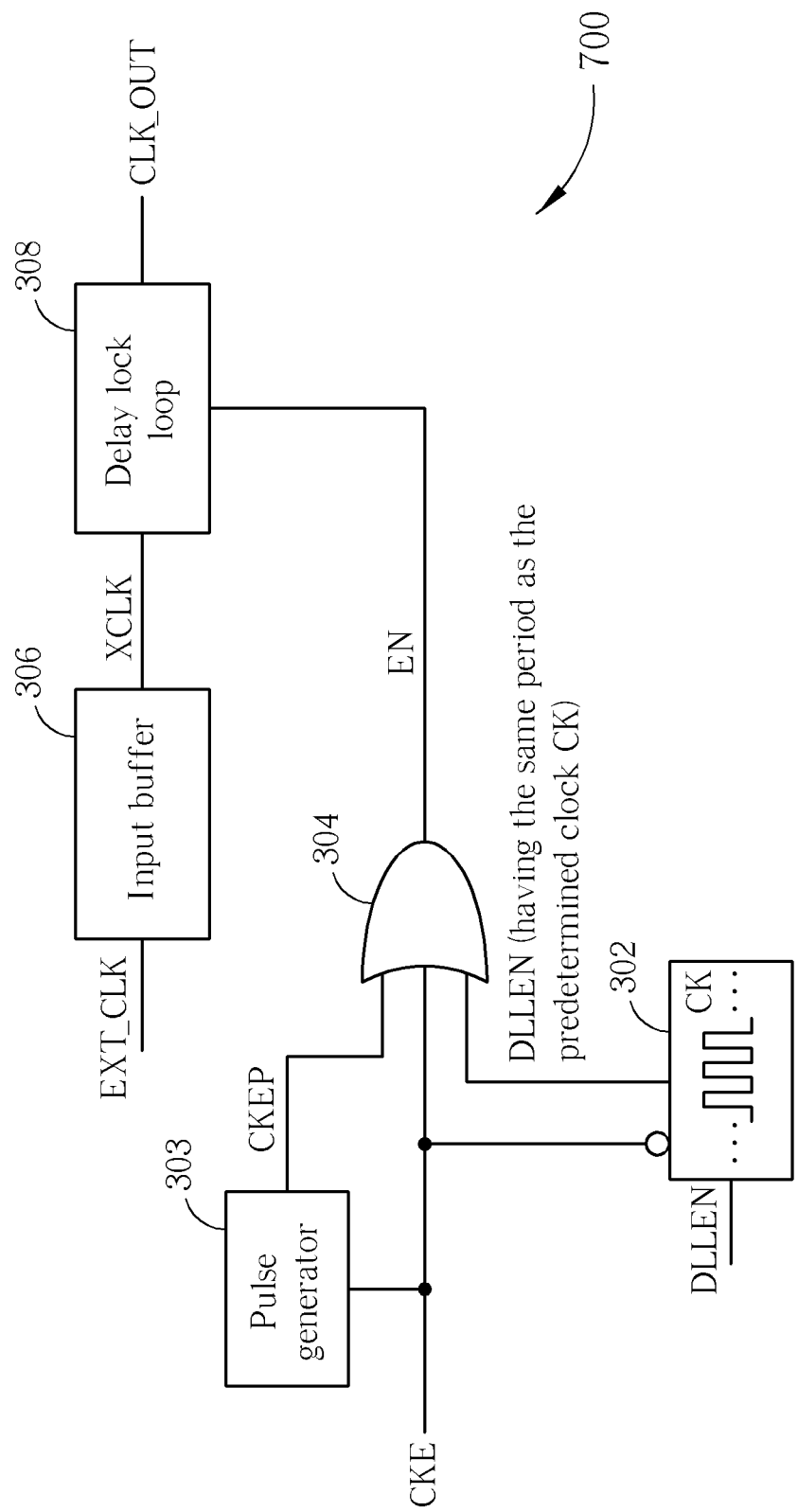
FIG. 7 is a diagram illustrating a delay lock loop system with a self-tracking function according to another embodiment.

Please refer to FIG. 7. FIG. 7 is a diagram illustrating a delay lock loop system 700 with a self-tracking function according to another embodiment. A difference between the delay lock loop system 700 and the delay lock loop system 300 is that the timing controller 302 of the delay lock loop system 700 is used for receiving the external enable signal DLLEN, and outputting the external enable signal DLLEN according to a predetermined clock CK included by the timing controller 302. Further, subsequent operational principles of the delay lock loop system 700 are the same as those of the delay lock loop system 300, so further description thereof is omitted for simplicity.

Figure 8:
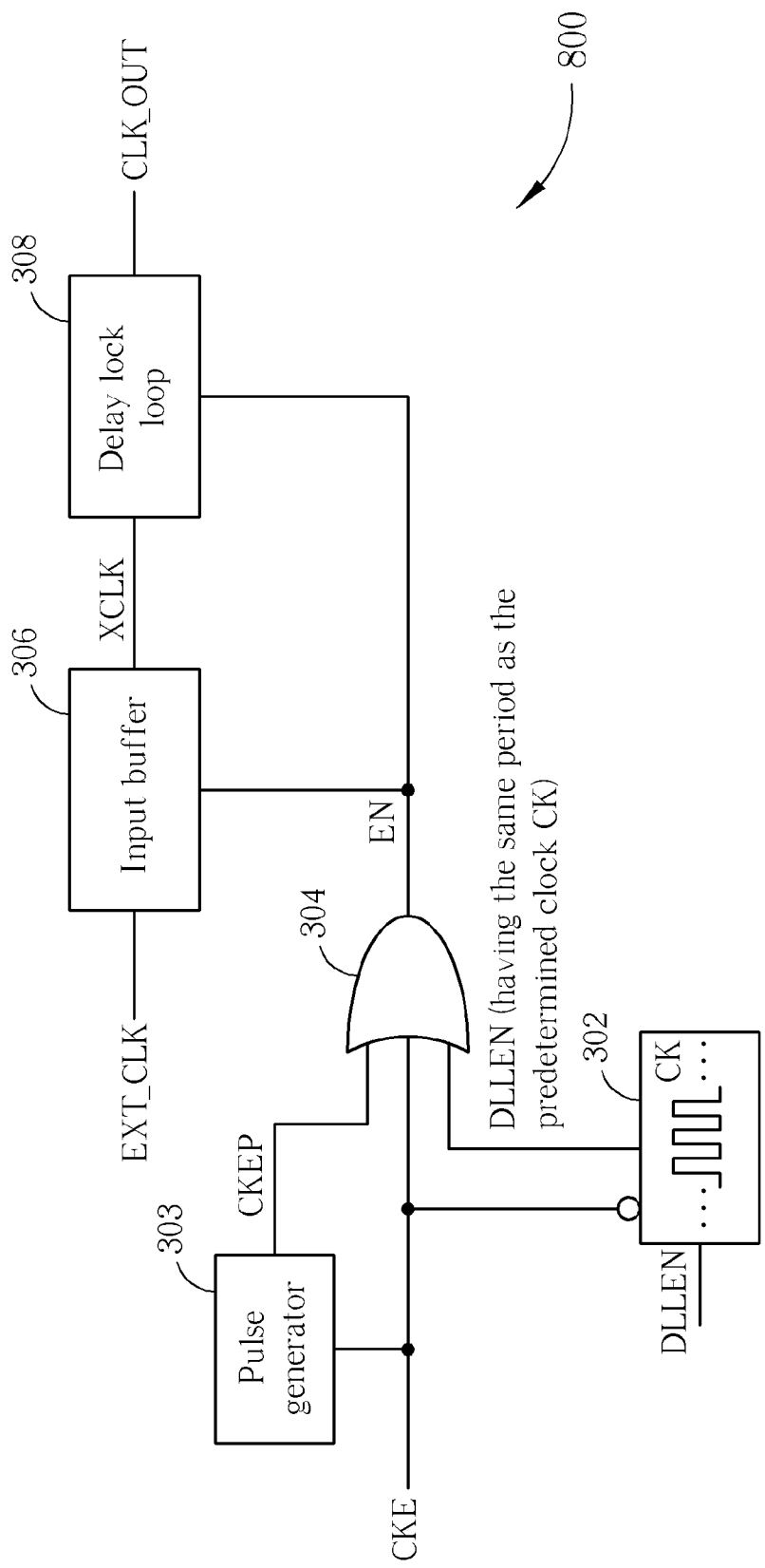
FIG. 8 is a diagram illustrating a delay lock loop system with a self-tracking function according to another embodiment.

Please refer to FIG. 8. FIG. 8 is a diagram illustrating a delay lock loop system 800 with a self-tracking function according to another embodiment. A difference between the delay lock loop system 800 and the delay lock loop system 600 is that the timing controller 302 of the delay lock loop system 800 is used for receiving the external enable signal DLLEN, and outputting the external enable signal DLLEN according to a predetermined clock CK included by the timing controller 302. Further, subsequent operational principles of the delay lock loop system 800 are the same as those of the delay lock loop system 600, so further description thereof is omitted for simplicity.

Figure 9:
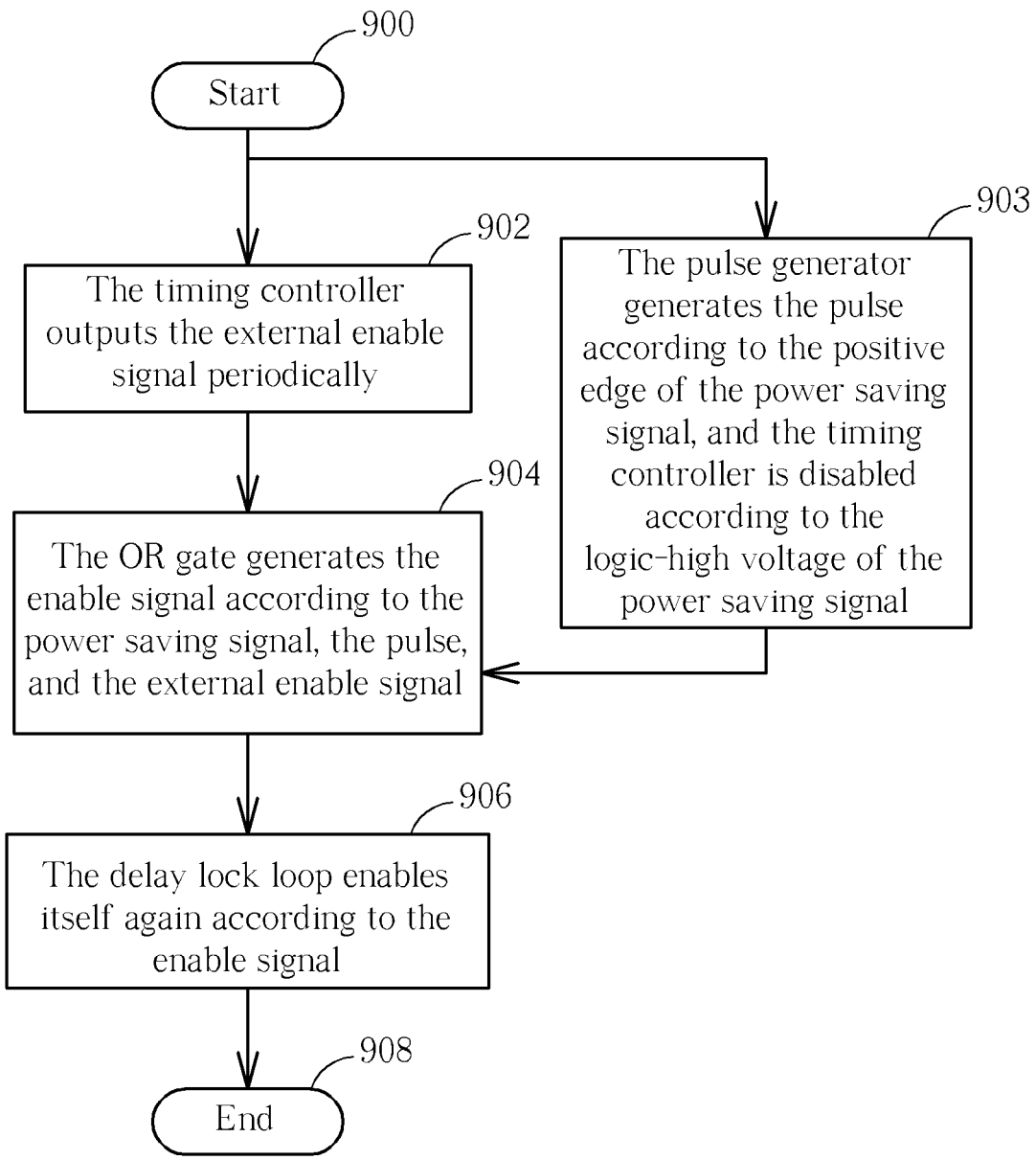
FIG. 9 is a flowchart illustrating a method of self tracking of a delay lock loop system according to another embodiment.

Please refer to FIG. 9. FIG. 9 is a flowchart illustrating a method of self tracking of a delay lock loop system according to another embodiment. The method in FIG. 9 uses the delay lock loop system 300 in FIG. 3 for illustration. Detailed steps are as follows:

Step 900: Start.

Step 902: The timing controller 302 outputs the external enable signal DLLEN periodically.

Step 903: The pulse generator 303 generates the pulse CKEP according to the positive edge of the power saving signal CKE, and the timing controller 302 is disabled according to the logic-high voltage of the power saving signal CKE.

Step 904: The OR gate 304 generates the enable signal EN according to the power saving signal CKE, the pulse CKEP, and the external enable signal DLLEN.

Step 906: The delay lock loop 308 enables itself again according to the enable signal EN.

Step 908: End.

In Step 906, the delay lock loop 308 can still enable itself again according to the enable signal EN while the power saving signal CKE is at the logic-low voltage. Therefore, due to the leakage of the capacitor 102 is smaller, the output clock CLK_OUT of the delay lock loop 308 has the smaller phase error when the delay lock loop 308 is enabled again after the power saving signal CKE is changed from the logic-low voltage to the logic-high voltage.

Figure 10:
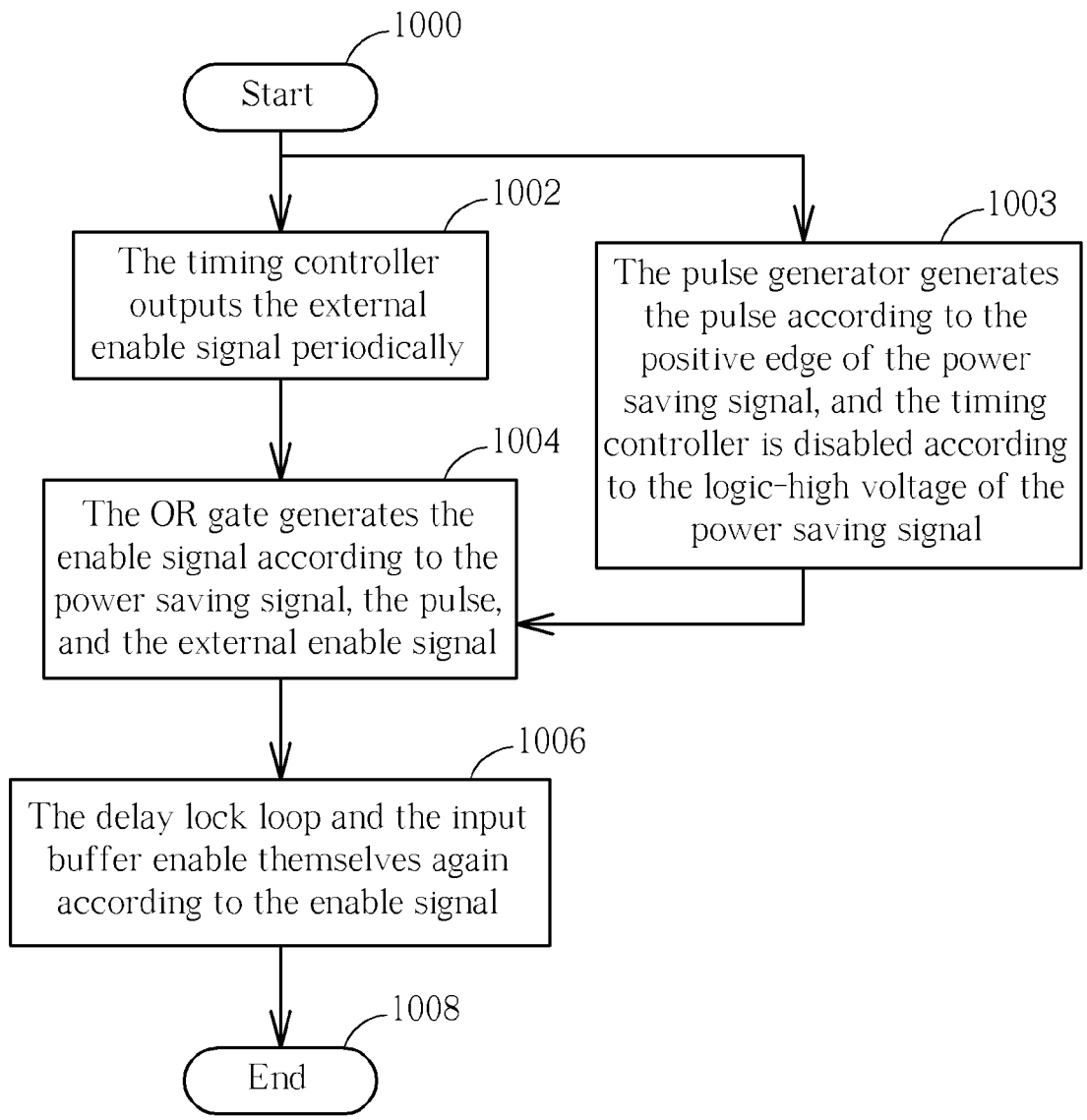
FIG. 10 is a flowchart illustrating a method of self tracking of a delay lock loop system according to another embodiment.

Please refer to FIG. 10. FIG. 10 is a flowchart illustrating a method of self tracking of a delay lock loop system according to another embodiment. The method in FIG. 10 uses the delay lock loop system 600 in FIG. 6 for illustration. Detailed steps are as follows:

Step 1000: Start.

Step 1002: The timing controller 302 outputs the external enable signal DLLEN periodically.

Step 1003: The pulse generator 303 generates the pulse CKEP according to the positive edge of the power saving signal CKE, and the timing controller 302 is disabled according to the logic-high voltage of the power saving signal CKE.

Step 1004: The OR gate 304 generates the enable signal EN according to the power saving signal CKE, the pulse CKEP, and the external enable signal DLLEN.

Step 1006: The delay lock loop 308 and the input buffer 306 enable themselves again according to the enable signal EN.

Step 1008: End.

A difference between the method in FIG. 10 and the method in FIG. 9 is that in Step 1006, the delay lock loop 308 and the input buffer 306 enable themselves again according to the enable signal EN. Further, subsequent operational principles of the method in FIG. 10 are the same as those of the method in FIG. 9, so further description thereof is omitted for simplicity.

Figure 11:
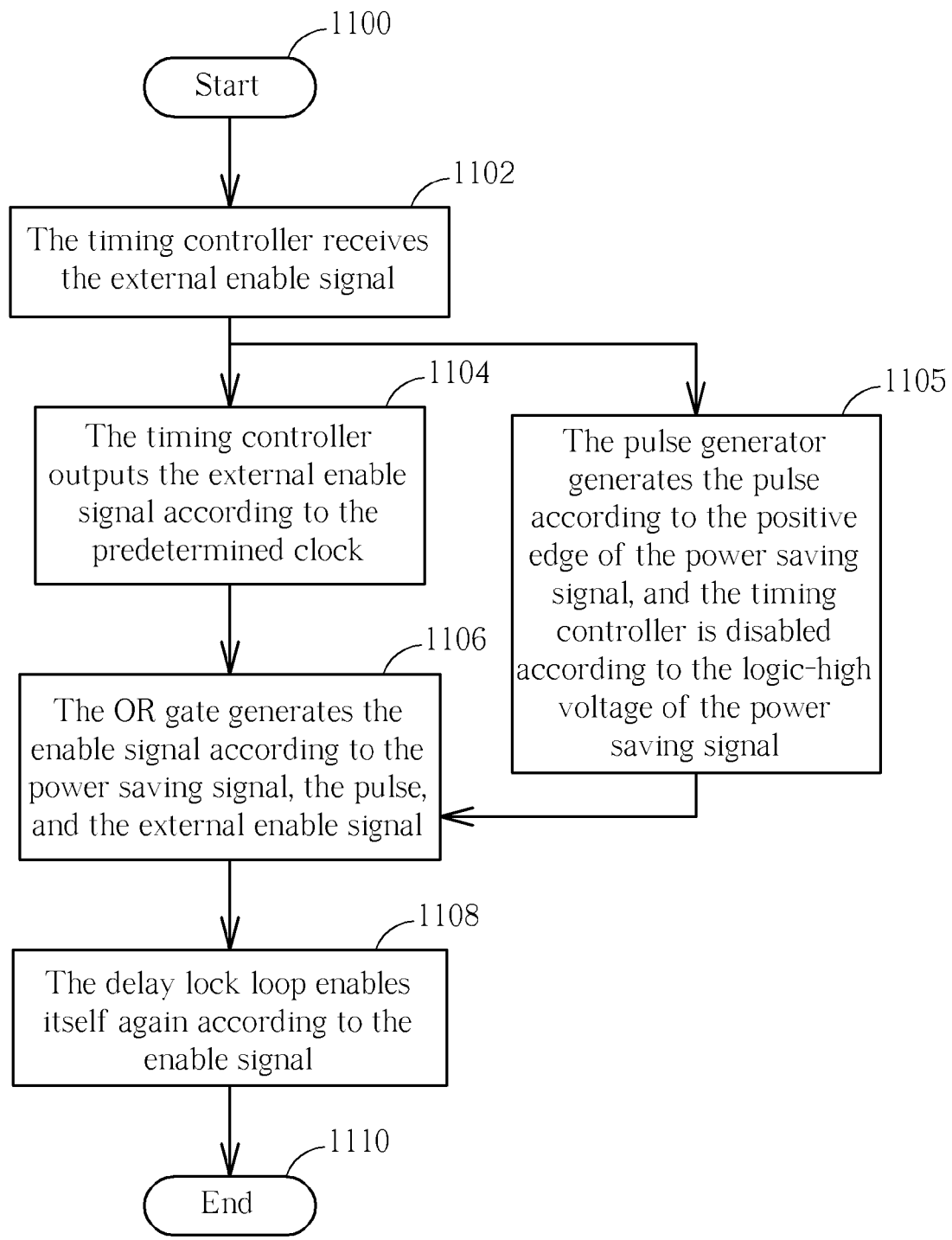
FIG. 11 is a flowchart illustrating a method of self tracking of a delay lock loop system according to another embodiment.

Please refer to FIG. 11. FIG. 11 is a flowchart illustrating a method of self tracking of a delay lock loop system according to another embodiment. The method in FIG. 11 uses the delay lock loop system 700 in FIG. 7 for illustration. Detailed steps are as follows:

Step 1100: Start.

Step 1102: The timing controller 302 receives the external enable signal DLLEN.

Step 1104: The timing controller 302 outputs the external enable signal DLLEN according to the predetermined clock CK.

Step 1105: The pulse generator 303 generates the pulse CKEP according to the positive edge of the power saving signal CKE, and the timing controller 302 is disabled according to the logic-high voltage of the power saving signal CKE.

Step 1106: The OR gate 304 generates the enable signal EN according to the power saving signal CKE, the pulse CKEP, and the external enable signal DLLEN.

Step 1108: The delay lock loop 308 enables itself again according to the enable signal EN.

Step 1110: End.

In Step 1104, the timing controller 302 outputs the external enable signal DLLEN to the OR gate 304 according to the predetermined clock CK. Further, subsequent operational principles of the method in FIG. 11 are the same as those of the method in FIG. 9, so further description thereof is omitted for simplicity.

Figure 12:
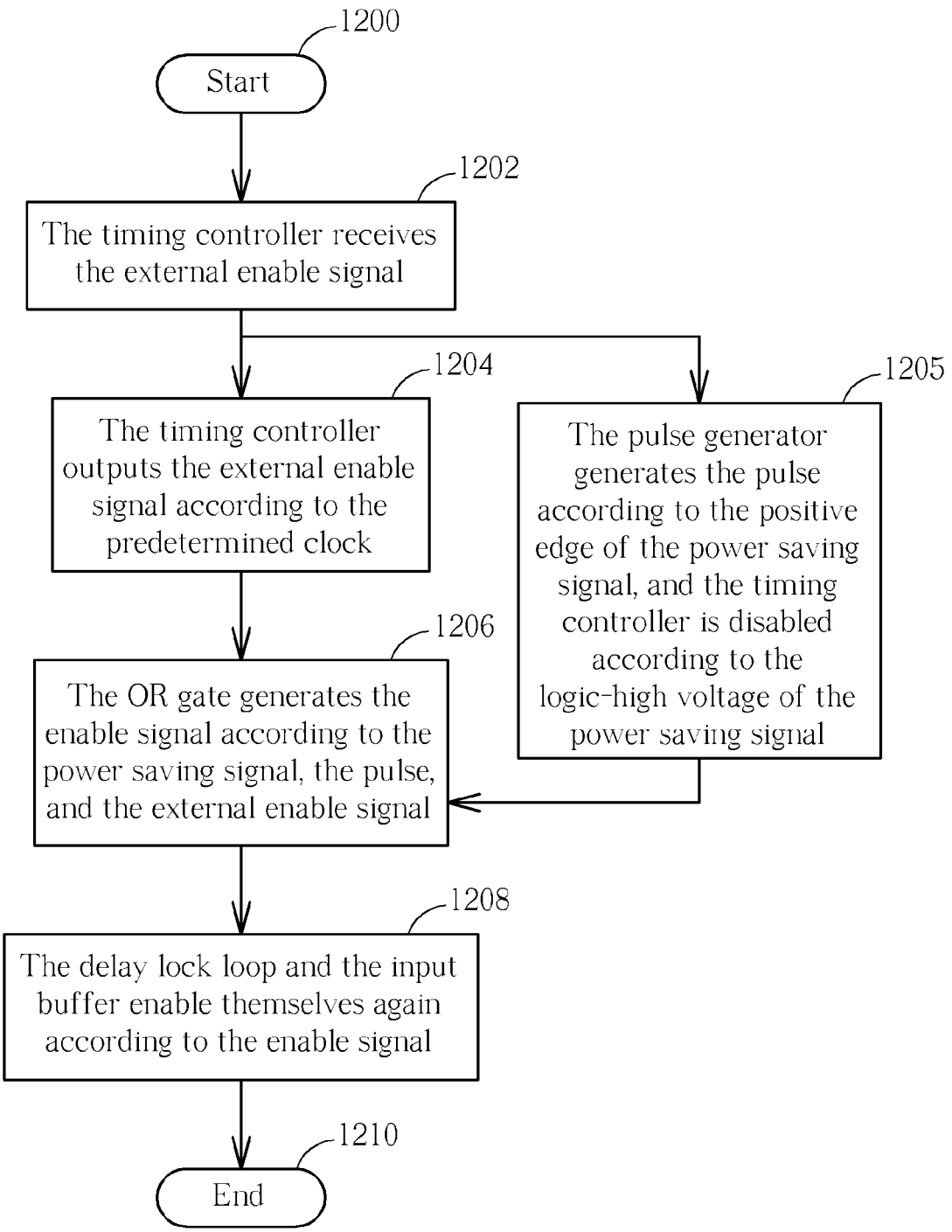
FIG. 12 is a flowchart illustrating a method of self tracking of a delay lock loop system according to another embodiment.

Please refer to FIG. 12. FIG. 12 is a flowchart illustrating a method of self tracking of a delay lock loop system according to another embodiment. The method in FIG. 12 uses the delay lock loop system 800 in FIG. 8 for illustration. Detailed steps are as follows:

Step 1200: Start.

Step 1202: The timing controller 302 receives the external enable signal DLLEN.

Step 1204: The timing controller 302 outputs the external enable signal DLLEN according to the predetermined clock CK.

Step 1205: The pulse generator 303 generates the pulse CKEP according to the positive edge of the power saving signal CKE, and the timing controller 302 is disabled according to the logic-high voltage of the power saving signal CKE.

Step 1206: The OR gate 304 generates the enable signal EN according to the power saving signal CKE, the pulse CKEP, and the external enable signal DLLEN.

Step 1208: The delay lock loop 308 and the input buffer 306 enable themselves again according to the enable signal EN.

Step 1210: End.

A difference between the method in FIG. 12 and the method in FIG. 11 is that in Step 1208, the delay lock loop 308 and the input buffer 306 enable themselves again according to the enable signal EN. Further, subsequent operational principles of the method in FIG. 12 are the same as those of the method in FIG. 11, so further description thereof is omitted for simplicity.

To sum up, the delay lock loop system with the self-tracking function and method thereof utilize the OR gate to output the enable signal according to the power saving signal, the pulse, and the external enable signal while the power saving signal is at the logic-low voltage. Then, the delay lock loop can enable itself again according to the enable signal. Thus, because the leakage of the capacitor of the delay lock loop (that is, the reduced voltage of the control node) is smaller, the delay lock loop has the smaller phase error. In addition, the OR gate outputs the enable signal for enabling the delay lock loop according to the power saving signal, the pulse, and the external enable signal, and the delay lock loop can still track the environmental temperature while the power saving signal is at the logic-low voltage. Therefore, when the delay lock loop is enabled again, the difference between the delay time of the delay lock loop and the delay time of the delay lock loop operating at the normal temperature is smaller, so the output clock of the delay lock loop has the smaller phase error.

Those skilled in the art will readily observe that numerous modifications and alterations of the device and method may be made while retaining the teachings of the invention.

What is claimed is:

1. A delay lock loop system with a self-tracking function, the delay lock loop system comprising:
    a timing controller for outputting an external enable signal periodically while a power saving signal is a logic-low voltage, and being disabled according to a logic-high voltage of the power saving signal;
    a pulse generator for generating a pulse according to a positive edge of the power saving signal;
    an OR gate having a first terminal for receiving the power saving signal, a second terminal coupled to the timing controller for receiving the external enable signal, a third terminal coupled to the pulse generator for receiving the pulse, and an output terminal for outputting an enable signal;
    an input buffer for receiving an external clock, and outputting an adjusted clock; and
    a delay lock loop (DLL) coupled to the OR gate and the input buffer for receiving the adjusted clock and the enable signal, the delay lock loop comprising a voltage control delay circuit for synchronizing a phase of the adjusted clock with a phase of an output clock of the delay lock loop, and the delay lock loop being enabled again according to the enable signal.

2. The delay lock loop system of claim 1, wherein the input buffer further is coupled to the OR gate for receiving the enable signal.

3. The delay lock loop system of claim 1, wherein the timing controller is used for receiving the external enable signal, and outputting the external enable signal according to a predetermined clock.

4. A method of self tracking of a delay lock loop system, the method comprising:
    a timing controller outputting an external enable signal periodically;
    disabling the timing controller according to a logic-high voltage of a power saving signal, and a pulse generator generating a pulse according to a positive edge of the power saving signal;
    generating an enable signal according to the power saving signal, the external enable signal, and the pulse; and
    enabling the delay lock loop again according to the enable signal.

5. The method of claim 4, further comprising:
    enabling the delay lock loop and an input buffer again according to the enable signal.

6. A method of self tracking of a delay lock loop system, the method comprising:
    a timing controller receiving an external enable signal;
    the timing controller outputting the external enable signal according to a predetermined clock;
    disabling the timing controller according to a logic-high voltage of a power saving signal, and a pulse generator generating a pulse according to a positive edge of the power saving signal;
    generating an enable signal according to the power saving signal, the external enable signal, and the pulse; and
    enabling the delay lock loop again according to the enable signal.

7. The method of claim 6, further comprising:
    enabling the delay lock loop and an input buffer again according to the enable signal.

* * * * *